United States Patent
Andreoni et al.

(10) Patent No.: US 11,908,963 B2
(45) Date of Patent: Feb. 20, 2024

(54) PHOTOVOLTAIC DEVICE WITH BAND-STOP FILTER

(71) Applicants: International Business Machines Corporation, Armonk, NY (US); Egypt Nanotechnology Center, Cairo (EG)

(72) Inventors: Wanda Andreoni, Adliswil (CH); Alessandro Curioni, Rueschlikon (CH); Petr Khomyakov, Rueschlikon (CH); Jeehwan Kim, Los Angeles, CA (US); Devendra K. Sadana, Pleasantville, NY (US); Nasser D. Afify, Giza (EG)

(73) Assignees: INTERNATIONA BUSINESS MACHINES CORPORATION, Armonk, NY (US); EGYPT NANOTECHNOLOGY CENTER, Cairo (EG)

( * ) Notice: Subject to any disclaimer, the term of this patent is extended or adjusted under 35 U.S.C. 154(b) by 1303 days.

(21) Appl. No.: 13/900,588

(22) Filed: May 23, 2013

(65) Prior Publication Data

US 2013/0312828 A1  Nov. 28, 2013

(30) Foreign Application Priority Data

May 24, 2012 (GB) .................................... 1209080

(51) Int. Cl.
 *H01L 31/0376*   (2006.01)
 *H01L 31/0216*   (2014.01)

(52) U.S. Cl.
 CPC .... *H01L 31/0376* (2013.01); *H01L 31/02165* (2013.01); *H01L 31/02168* (2013.01); *Y02E 10/52* (2013.01)

(58) Field of Classification Search
 CPC ........... H01L 31/0376; H01L 31/02165; H01L 31/02168; H01L 31/02162;
 (Continued)

(56) References Cited

U.S. PATENT DOCUMENTS

| 4,521,447 A | * 6/1985 | Ovshinsky .............. H01L 31/06 136/258 |
| 5,242,505 A | 9/1993 | Lin et al. |

(Continued)

FOREIGN PATENT DOCUMENTS

| CN | 201809879 U | 4/2011 |
| EP | 2139048 A1 | 12/2009 |

(Continued)

OTHER PUBLICATIONS

Energy of Photon; PV Education.org; http://www.pveducation.org/pvcdrom/properties-of-sunlight/energy-of-photon; published Jul. 12, 2010; accessed and printed Jun. 18, 2015.*

(Continued)

*Primary Examiner* — Angelo Trivisonno
(74) *Attorney, Agent, or Firm* — CANTOR COLBURN LLP; David Mattheis (57) ABSTRACT

Photovoltaic device with band-stop filter. The photovoltaic device includes an amorphous photovoltaic material and a band-stop filter structure having a stopband extending from a lower limiting angular frequency $\omega_{min} \geq 0$ to an upper limiting angular frequency $\omega_{max}$ where $\omega_{max} > \omega_{min}$. The band-stop filter structure is arranged in the photovoltaic device relative to the photovoltaic material in order to attenuate electromagnetic radiations reaching the photovoltaic material with angular frequencies of $\omega^*$ in the stopband, so that $\omega_{min} < \omega^* < \omega_{max}$. The angular frequencies $\omega^*$ correspond to electronic excitations $\hbar\omega^*$ from valence band tail (VBT) states of the amorphous photovoltaic material to (Continued)

conduction band tail (CBT) states of the amorphous photovoltaic material.

17 Claims, 6 Drawing Sheets

(58) Field of Classification Search
CPC ..... H01L 31/02164; G02B 5/28; G02B 5/281; G02B 5/282; G02B 5/283; G02B 5/284; G02B 5/285; G02B 5/288
See application file for complete search history.

(56) References Cited

U.S. PATENT DOCUMENTS

| 5,315,128 | A | * | 5/1994 | Hunt | H01L 31/105 |
| | | | | | 257/17 |
| 2004/0154654 | A1 | | 8/2004 | Mortenson | |
| 2007/0246716 | A1 | | 10/2007 | Bhat et al. | |
| 2009/0032098 | A1 | * | 2/2009 | Lu | G02B 1/115 |
| | | | | | 136/252 |
| 2009/0159123 | A1 | * | 6/2009 | Kothari | H01L 31/02165 |
| | | | | | 136/256 |
| 2009/0199889 | A1 | | 8/2009 | Willmott | |
| 2009/0229661 | A1 | | 9/2009 | Mortenson | |
| 2009/0320913 | A1 | | 12/2009 | Smith et al. | |
| 2010/0065116 | A1 | * | 3/2010 | Stancel | B32B 27/38 |
| | | | | | 136/256 |
| 2010/0096011 | A1 | * | 4/2010 | Griffiths | G02B 5/288 |
| | | | | | 136/257 |
| 2011/0041903 | A1 | * | 2/2011 | Zehavi | H01L 31/022425 |
| | | | | | 136/255 |
| 2011/0088778 | A1 | * | 4/2011 | Lin | H01L 31/1884 |
| | | | | | 136/257 |
| 2011/0226330 | A1 | | 9/2011 | Grossman et al. | |
| 2011/0232754 | A1 | | 9/2011 | Myong | |

FOREIGN PATENT DOCUMENTS

| EP | 2315257 A2 | 4/2011 |
| JP | S571263 A | 1/1982 |
| JP | S63234567 A | 9/1988 |
| JP | 2009520360 A | 5/2009 |
| JP | 2010531067 A | 9/2010 |
| JP | 4636719 B2 | 2/2011 |
| JP | 2012506148 A | 3/2012 |
| WO | 9526571 A1 | 10/1995 |
| WO | 2011064691 A2 | 6/2011 |

OTHER PUBLICATIONS

Lecture 14; University of California-Berkeley; http://www-inst.eecs.berkeley.edu/~ee119/sp10/Lecture%2014.pdf; published in 2000; accessed and printed Jun. 14, 2015.*

Isabella, O. et al.; Application of Photonic Crystals as Back Reflectors in the Thin-Film Silicon Solar Cells; 24th European Photovoltaic Solar Energy Conference; Sep. 25, 2009; http://www.researchgate.net/profile/Olindo_Isabella/publication/240087612; accessed and printed Jun. 14, 2015.*

Define: attenuate; thefreedictionary.com; http://www.thefreedictionary.com/attenuate; accessed and printed Jan. 13, 2016.*

Zhu, Furong et al.; An approach to study the effect of the band tail widths on the photovoltaic performance of p-i-n a-Si:H Solar cells; Journal of Non-Crystalline Solids; 163 (1993) pp. 65-73.*

Zhu, "An approach to study the effect of the band tail widths on the photovoltaic performance of p-i-n a-Si:H solar cells" Journal of Non-Crystalline Solids vol. 163, Issue 1, Oct. 1993, pp. 65-73 (Year: 1993).*

PCT International Search Report and Written Opinion; International Application No. PCT/IB2013/053380; International Filing Date: Apr. 29, 2013; dated Oct. 17, 2013; pp. 1-11.

J. Yang, et al., "Status and Future Perspective of a-Si:H, a SiGe:H, and nc-Si:H thin film photovoltaic Tech," Invited Paper, Proc. of SPIE, vol. 7409, 2009, Troy Michigan, US, pp. 1-14.

J. Ashbach, "A Single Material Alternative to a Multilayer Optical Window," Antennas and Pro. Soc Int. Sym (APSURSI), IEEE, Jul. 11-17, 2012, pp. 1-4.

J.M Butcher, et al., "Band Stop Absorption Filters for Use with CO2 Lasers," J. Physics E: Sci Instruments, 1983, vol. 16, No. 11, pp. 1026-1028.

Yoel Fink, et al., "A Dielectric Omnidirectional Reflector," Science, Nov. 27, 1998, pp. 1679-1682, vol. 282.

M. Gunes, et al., "Effects of Native and Light Induced Defects on Optoelectronic Propperties of Hydrogenate Amorphous Silicon-Germanium (a-SiGe:H) Alloy Thin Films," J. Material Sci: Mater Elec, 2010, pp. 153-159.

W.W. Hernandez-Montero, et al.,"Optical and Compositional Properties of Amorphous silicon-germanium films by Plasma Processing for Integrated Photonics," Opt Material Express, 2012, pp. 358-370, vol. 214.

A. Mokri, et al., "A Photovoltaic System with Three Solar Cells and a Band-Stop Optical Filter," Journal of Renewable and Sustainable Energy 3, 023113, Apr. 27, 2011, pp. 1-9.

M.H. Asghar, et al., "Modeling and preparation of Practical Optical Filters," Current App. Phys., 2009, vol. 9, Iss. 5, pp. 1046-1053.

J. Tauc, et al., "Optical Properties and Electronic Structure of Amorphous Germanium," Phys. Stat., vol. 15, Mar. 29, 1966, pp. 627-637.

R.B. Wehrspohn, "Dangling-bond Defect State Creatioon in Microsocrystalline Silicon Thin-Film Transistors," Appl. Phys. Letter, 2000, pp. 750-752, vol. 77, No. 5.

R.A. Street, "Hydrogenated Amorphous Silicon," Cambridge Univ. Press, Xerox Corporation, Palo Alto Research Center, 1991, pp. 1-21.

JP Search Report and English Translation; Application No. JP 2015-513299; dated Jan. 12, 2017; 26 pages.

* cited by examiner

PHOTOVOLTAIC DEVICE WITH BAND-STOP FILTER

CROSS-REFERENCE TO RELATED APPLICATION

This application claims priority under 35 U.S.C. § 119 from Great Britain Patent Application No. 1209080.9 filed May 24, 2012, the entire contents of which are incorporated herein by reference.

BACKGROUND OF THE INVENTION

1. Field of the Invention

The present invention is related to the field of thin-film photovoltaic devices, which are devices including amorphous semiconductor materials as light absorbing materials. More particularly, it is directed to thin-film PV cells including a band-stop filter to reduce photo degradation effects.

2. Description of the Related Art

Provided are some basic definitions of the related art. Photovoltaics (PV) generate electrical power by converting solar radiation into direct current electricity through materials exhibiting the photovoltaic effect. A photovoltaic cell, or PV cell, also solar cell or photoelectric cell is a solid state device, semiconductor PV cells, or a polymer device (e.g., organic PV cells) that converts energy of light directly into electricity by virtue of the photovoltaic effect.

A thin-film photovoltaic cell, or thin-film solar cell, is a solar cell made of one or more thin layers (or thin films) of photovoltaic material, deposited on a substrate. The thickness of a deposited layer ranges from nanometers to tens of micrometers or more. Thin-film PV cells can be categorized according to the PV material used, for example: Amorphous silicon (a-Si), Other thin-film silicon (TF-Si), Cadmium Telluride (CdTe), Copper indium gallium selenide (CIS or CIGS), and Dye-sensitized solar cell (DSC) or other polymer/organic solar cells, etc. A photovoltaic module, also solar module, solar panel or photovoltaic panel, is an assembly of connected photovoltaic cells.

Amorphous silicon (a-Si) refers to a non-crystalline phase of silicon. It can be deposited in thin films at relatively low temperatures, typically in the range of 200-300° C., onto a variety of substrates, and offers capabilities for many applications including photovoltaics at a moderate cost. A-Si material can be passivated by hydrogen. Hydrogen atoms bond to dangling bonds. Hydrogen passivation can reduce dangling bond density by orders of magnitude, so that most Si atoms are 4-fold coordinated, just as in single-crystalline Si (c-Si) or $SiH_4$ molecule. Hydrogenated amorphous silicon (a-Si:H) has a sufficiently low amount of defects to be used within devices. Without hydrogen, a-Si would have a high density of defects due to unpassivated dangling bonds, which notably alters photoconductivity. In the literature, the presence of hydrogen in a-Si:H-based devices is believed to be the main factor in leading to the light induced degradation effects of the material, termed the Staebler-Wronski Effect.

Plasma-enhanced chemical vapor deposition (PECVD) is a dominant technique used for the growth of a-Si:H-based amorphous materials. Hydrogenated amorphous silicon thin-film cells typically use a p-i-n structure. Usual panel structures include front side glass, transparent conducting oxides, thin film silicon, back contact, polyvinyl butyral (PVB), and back side glass.

SUMMARY OF THE INVENTION

One aspect of the present invention provides a photovoltaic device. The photovoltaic device includes an amorphous photovoltaic material and a band-stop filter structure having a stopband extending from a lower limiting angular frequency $\omega_{min} \geq 0$ to an upper limiting angular frequency $\omega_{max}$ where $\omega_{max} > \omega_{min}$. The band-stop filter structure is arranged in the photovoltaic device relative to the photovoltaic material in order to attenuate electromagnetic radiations reaching the photovoltaic material with angular frequencies of $\omega^*$ in the stopband, so that $\omega_{min} < \omega^* < \omega_{max}$. The angular frequencies $\omega^*$ correspond to electronic excitations $\hbar\omega^*$ from valence band tail (VBT) states of the amorphous photovoltaic material to conduction band tail (CBT) states of the amorphous photovoltaic material.

Another aspect of the present invention provides method of operating a photovoltaic device. The method includes exposing the photovoltaic device to radiation. The method further includes filtering, via a band-stop filter structure, out electromagnetic radiation reaching a light absorbing material with angular frequencies of $\omega^*$ within the stopband. The band-stop filter has a stopband extending from a lower limiting angular frequency $\omega_{min} \geq 0$ to an upper limiting angular frequency $\omega_{max}$, where $\omega_{max} > \omega_{min}$. The angular frequencies $\omega^*$ correspond to electronic excitations $\hbar\omega^*$ from valence band tail (VBT) states of the amorphous photovoltaic material to conduction band tail (CBT) states of the amorphous photovoltaic material. The method further includes producing an electrical power using the photovoltaic device.

BRIEF DESCRIPTION OF THE DRAWINGS

Devices and methods embodying the present invention will now be described, by way of non-limiting examples, and in reference to the accompanying drawings.

FIG. 6A is multiple-junction photovoltaic device with a single reflecting/absorbing filter for selecting out radiations with given frequencies, according to a further embodiment of the present invention.

FIG. 6B is multiple-junction photovoltaic device with a single reflecting/absorbing filter for selecting out radiations with given frequencies, according to a further embodiment of the present invention.

FIG. 6C is a multiple-junction photovoltaic devices having a layer structure, with two reflecting/absorbing filters for selecting out radiations with given frequencies, according to a further embodiment of the present invention.

FIG. 10A is a schematic representation of a triple-junction photovoltaic device according to a further embodiment of the present invention.

FIG. 10B is a schematic representation of a triple-junction photovoltaic device according to a further embodiment of the present invention.

FIG. 10C is a schematic representation of a double-junction photovoltaic device according to a further embodiment of the present invention.

FIG. 10D is a schematic representation of a double-junction photovoltaic device according to a further embodiment of the present invention.

FIG. 10E is a schematic representation of a double-junction photovoltaic device according to a further embodiment of the present invention.

FIG. 10F is a schematic representation of a double-junction photovoltaic device according to a further embodiment of the present invention.

DETAILED DESCRIPTION OF THE PREFERRED EMBODIMENTS

Present inventors have identified a fundamental mechanism responsible for the photodegradation effect, the Staebler-Wronski effect. Based on this discovery, they have devised new solutions to reduce photodegration effects in PV devices. These solutions take advantage of one or more band-stop filter structures, or closely related filter structures, incorporated in a PV device.

The main idea is to incorporate a band-stop filter structure to block electronic excitations responsible for the photodegradation in the active amorphous material(s). The reason is, as present inventors have discovered, that electronic excitations from valence band tail (VBT) states to conduction band tail (CBT) states of an amorphous photovoltaic material are responsible for photodegradation effects.

In the prior literature, light induced degradation was generally believed to be associated to the presence of hydrogen atoms passivating a-Si dangling bonds. Currently, it is proposed that VBT-to-CBT electronic excitations are causing this photodegradation. Such conclusions were drawn based on large-scale ab initio calculations and interpretations. Thus, the main goal of the PV designs proposed is to filter out that part of the light spectrum that causes the light-induced changes in amorphous PV semiconductor materials.

In reference to FIGS. 1-3 and 6-8, general aspects of the invention are described. New designs of PV devices 10a-e are proposed, which advantageously apply to thin film solar cells. As in prior art devices, such PV devices first include one or more amorphous PV semiconductors 34, also called absorber, or light absorbing material(s). "Amorphous photovoltaic material" should be interpreted broadly. More formally, amorphous PV material means that at least a substantial part of the PV absorber material is amorphous. The PV absorber can for instance be entirely amorphous. It can be realized that embodiments of the present invention can involve microcrystalline, nanocrystalline or micromorphous silicon. For instance, protocrystalline and amorphous silicon can be combined in a tandem solar cell.

Figure 2:
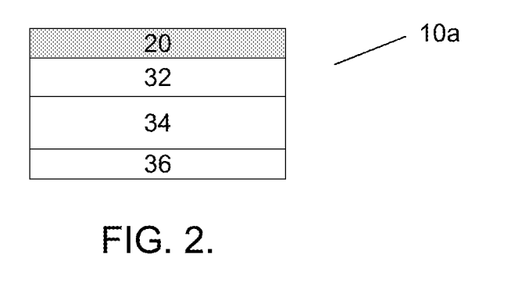
FIG. 2 is a schematic representation of an archetypal p-i-n single-junction photovoltaic device, complemented by a band-stop filter, according to a further embodiment of the present invention
Figure 3:
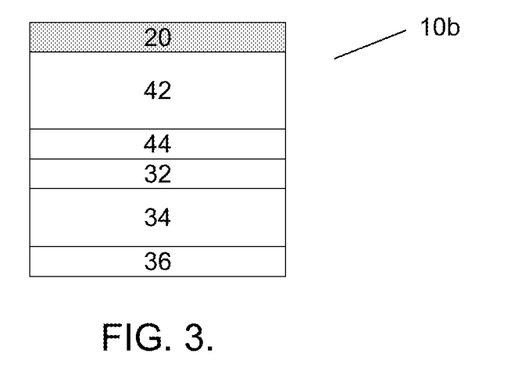
FIG. 3 is a schematic representation of a more specific implementation of the single-junction photovoltaic device according to a further embodiment of the present invention.
Figure 6:
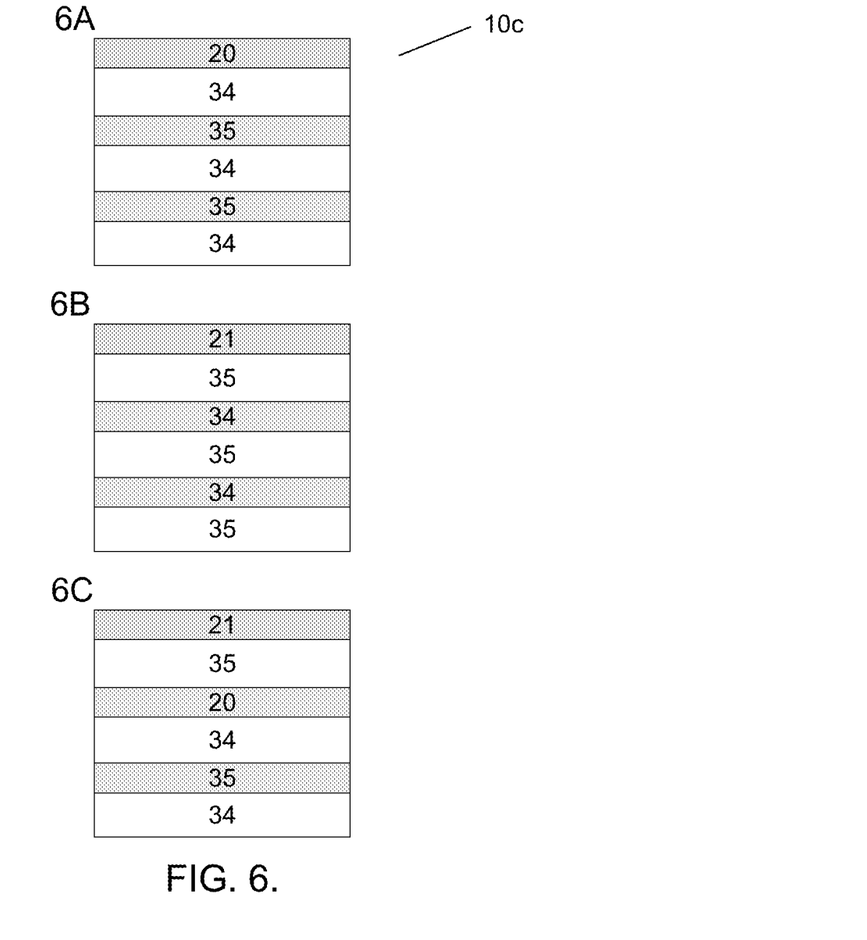
FIG. 6 is are schematic representations of multiple-junction photovoltaic devices having a layer structure, with a reflecting/absorbing filter structure for selecting out radiations with given frequencies, according to a further embodiment of the present invention.
Figure 7:
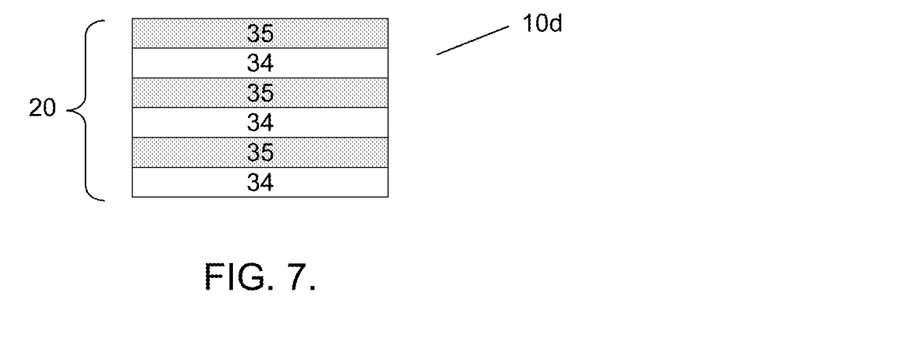
FIG. 7 is a multiple-junction photovoltaic device having a layer structure with only absorbing filters according to a further embodiment of the present invention.
Figure 8:
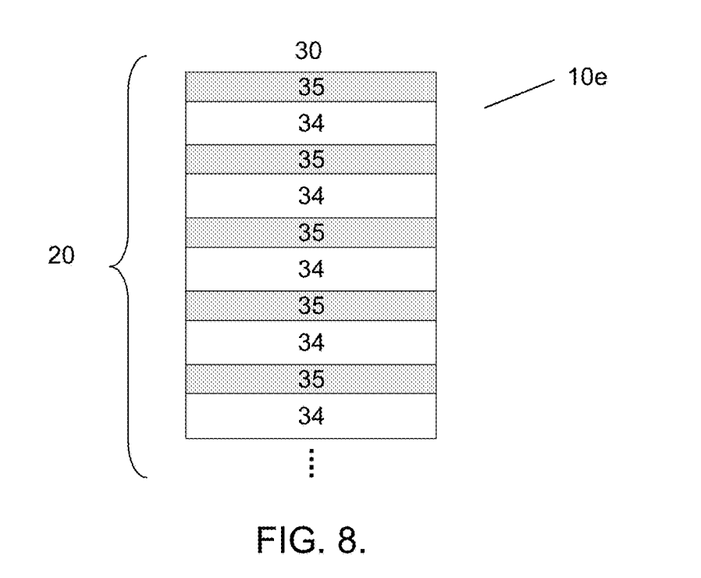
FIG. 8 is a schematic representation of another photovoltaic device, having a layer structure arranged as a superlattice, which acts as a reflector for radiations having undesired frequencies, according to a further embodiment of the present invention.

These amorphous semiconductors are the active PV components, which exhibit the desired photovoltaic effects, as known per se. They can consist of one or more layers of absorbing material, which upon exposure to radiation make it possible for producing electrical power. Present designs further include a band-stop filter structure 20, having a given stopband. The band-stop filter structure can include a filter layer 20 on one side of the absorber layer structure as shown in FIGS. 2, 3, and 6 or result from the layer structure itself, if opportunely engineered as shown in FIGS. 7 and 8. In all cases, the band-stop filter structure is suitably arranged in the device, with respect to the amorphous PV material(s) 34 and/or 35, to at least substantially attenuate external electromagnetic radiation that reaches it with angular frequency within the stopband.

As known by the ordinary person skilled in the art about band-stop filters in general, a band-stop filter structure can be designed to at least attenuate (i.e., substantially) or possibly completely prevent radiations having frequencies within a given stopband to pass through the filter and reach component(s) it is meant to protect.

In the present invention, and as a result of the above discovery, the stopband corresponds to electronic excitations $\hbar\omega^*$ from valence band tail states to conduction band tail states of the amorphous material. Thus, unlike existing methods which focus on the quality of the amorphous PV material, it is suggested to modify properties of radiations reaching it. When a PV device is exposed to radiation, e.g., sunlight with frequencies distributed over a wide spectrum, the filter structure filters out undesired radiation reaching the absorber. A PV device can be advantageously used to produce electrical power with reduced degradation upon exposure to sunlight.

Figure 1:
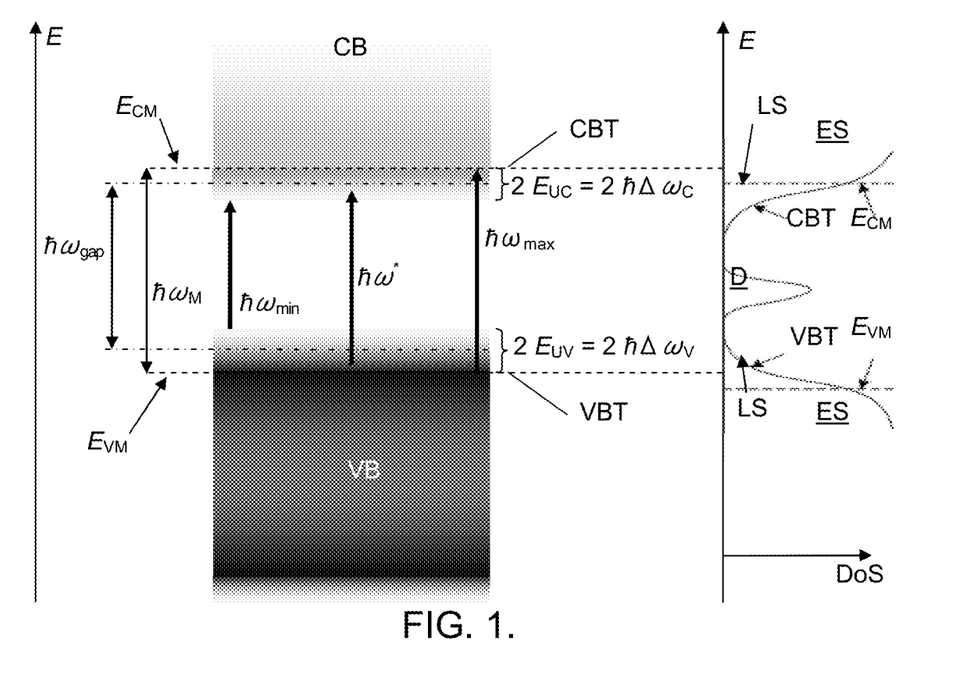
FIG. 1 shows an energy diagram (left) representing various possible electronic excitations, complemented by a schematic density of electronic states or DoS (right), in a typical amorphous semiconductor, to illustrate principles underlying embodiments of the present invention.

In FIG. 1, photons with energies about $\hbar\omega^*$ are the photons responsible for degradation. In order to block this mechanism, a filter is provided to protect the PV amorphous semiconductor by specifically sorting out the undesired part of the light spectrum, having angular frequencies near $\omega^*$.

The frequency range that induces the degradation is material-specific. Therefore, the band-stop filter structure has to be adjusted according to the amorphous PV semiconductor material(s) used in the device.

FIG. 1 schematically depicts energy levels in a typical amorphous semiconductor material as used in the present invention. In the following, one assumes that this material is a-Si:H or essentially based, for the sake of illustration. However, the photodegradation mechanism discussed below applies to a wide class of amorphous PV semiconductors. FIG. 1 notably shows:

the valence band VB of a given amorphous PV material, with its tail region (VBT);

the conduction band CB, with its tail region (CBT);

$\omega_{max}$ denotes an upper limiting angular frequency (of the stopband);

$\hbar\omega_M$ corresponds to the mobility gap;

$\omega_{min}$ is the lower limiting angular frequency (of the stopband);

$\hbar\omega_{gap}$ is the energy corresponding to the optical gap;

$E_{UC}$ is the CBT Urbach energy; and $E_{UV}$ represents the VBT Urbach energy, the average Urbach energy being hereafter denoted by $E_U$.

The energy band diagram is complemented by a schematic density of electronic states (DoS) for the same amorphous semiconductor. The DoS exhibits five distinct regions:

the VB region (corresponding to extended states ES);

The VBT region, corresponding to localized states LS;

A central peak corresponding to deep defects D. The latter is however not reflected in the left-hand energy level diagram since the deep defects do not play a critical role in the devised solutions;

The CBT region, corresponding again to localized states LS; and

The CB region, corresponding to extended states ES too.

Each of the mobility lines separates extended states ES from localized states LS.

The above-mentioned concepts, i.e., LS, ES, $E_{CM}$, $E_{VM}$, $\omega_{gap}$, etc., are now discussed. The lack of long-range order in a material such as a-Si:H has consequences on electrical and optical properties. The bonding disorder results in band tails and localization, while point-like defects result in electronic levels in the midgap. In a perfect single-crystalline solid, where a perfect crystalline solid means infinite, defect-free crystalline solid with no impurities, an electron would experience a periodic potential. It then follows from Bloch's theorem that the electronic states are "extended" states, inasmuch as electron wavefunctions extend all over the crystal. The position of an electron with given momentum k can be anywhere in the crystal, as a direct consequence of the uncertainty principle. In Mott's model, which is accepted as a standard model of amorphous materials, localized and extended states are separated by mobility edges. The CB mobility edge is denoted with $E_{CM}$, in analogy with the conduction band in single crystalline semiconductors. $E_{CM}$ denotes the lowest allowed energy of an "unbound" electron, the lowest extended state energy level which is unoccupied at zero temperature. Similarly, the valence band edge is denoted by $E_{VM}$.

Thus, extended states ES and localized states LS are separated by the mobility edges at energy $E_{CM}$ in the conduction band CB and energy $E_{VM}$ in the valence band VB. At zero temperature, only carriers above $E_{CM}$ and below $E_{VM}$ are mobile and can contribute to conduction. The energy difference between the two mobility edges is referred to as the mobility gap, which is typically about 1.8 eV. The localized states below $E_{CM}$ and above $E_{VM}$ are referred to as band tail states. They are generally assumed to decrease/increase exponentially, i.e., to be exponentially distributed in energy, notably because of the correlation of the conduction band tail with the Urbach edge. The exponential tail of the optical absorption coefficient in the vicinity of the bandgap energy in amorphous materials. The mobility edge, the VB and CB band tails and similarly the optical gap $\hbar\omega_{gap}$, are key descriptors of amorphous semiconductors, well documented in the literature. A standard definition of the optical gap is notably found in J. Tauc, R. Grigorovici, and A. Vancu, Phys. Stat. Sol. 15, 627 (1966). This definition is echoed in many textbooks and is assumed here.

As discussed above, present designs of PV devices filter out radiations having frequencies $\omega^*$ within the stopband of the filter, which corresponds to excitations $\hbar\omega^*$ from VBT states to CBT states of the amorphous PV material. The filtered frequencies $\omega^*$ are located between an upper limiting angular frequency $\omega_{max}$ and a lower limiting angular frequency $\omega_{min}$ of the stopband ($\omega_{max} > \omega_{min} \geq 0$). The determination of these limiting frequencies is explained later.

The band-stop filter should preferably not eliminate or significantly reduce the useful part of the light spectrum $\omega > \omega_M$ that generates the photocurrent. Thus, $\hbar\omega^*$ should be smaller than or equal (or at least close) to the mobility gap $\hbar\omega_M$ of the amorphous PV material. Indeed, the electronic excitations induced by photons with energies $\hbar\omega^*$ can be related to the sub-gap absorption due to optical transitions from VBT-LS to CBT-LS. Accordingly, the maximal transition energy allowed $\hbar\omega_{max}$, corresponding to an upper limiting angular frequency $\omega_{max}$ of the stopband is preferably equal to or slightly smaller or larger than the mobility gap $\hbar\omega_M$ of the amorphous material. As a result, all, or essentially all, electronic excitations $\hbar\omega^*$ from VBT states to CBT states can be prevented. In the example of FIG. 1, $\omega_{max}$ was assumed to be equal to $\omega_M$.

Similarly, one understands from FIG. 1 that there is no need to prevent excitations with $\omega < \omega_{min}$, such that a filter could be tuned to exhibit a lower limiting or cutoff frequency $\omega_{min} > 0$ (strictly). Due to the dispersion of the VBT and CBT states, $\omega_{min}$ is typically smaller than $\omega_{gap}$.

However, in variants, filters could be used which exhibit a lower limiting frequency $\omega_{min} = 0$. In this case, the band-stop filter reduces to a mere high-pass filter, as per definitions of band-stop vs. high-pass filters. Yet, suitably tuning the upper limiting or cutoff frequency $\omega_{max}$ as described above (e.g., $\omega_{max} = \omega_M$), undesired frequencies are anyway prevented. Such variants can for example be contemplated for single-junction PV cells such as depicted in FIGS. 2 and 3.

In this regard, photons with energies sufficiently smaller than the bandgap value create a negligible photocurrent, but these photons can still be harmful for the amorphous material since they can give rise to transitions between valence and conduction band tails that are each exponentially extending towards the midgap. Frequency $\omega_{min}$ can be regarded as an estimate for a cutoff frequency that is a "frontier" between relative harmless and essentially harmful radiations in the low frequency limit. In this respect the $\omega_M$ can be regarded as the corresponding high frequency "frontier".

As discussed above, the discovery mentioned earlier, there is a priori no need to filter out radiation frequencies $\omega$ for which $\omega < \omega_{min}$, such that a filter structure according to embodiments of the present invention could extend between $\omega_{min} \geq 0$ and $\omega_{max} > \omega_{min}$, especially in single-junction-like devices. However, things are somewhat more complicated for multi-junction cells. Layered structures as in FIGS. 6-7 are used for two main reasons. First, is that thinner layers degrade less compared to thicker ones, so that layers 34 and 35 in FIGS. 6 and 7 are typically made thinner than the active layer 34 of single-junction cells as represented in FIGS. 2 and 3. The total thickness of a typical multi-junction cell, however, is similar to that of a typical single-junction cell. Second, is that layer materials have different band gaps so additional layers, for example, a-SiGe:H that has smaller band gap than a-Si:H, are meant for capturing and converting to electricity a part of the light spectrum that is not absorbed by the top layer, e.g., layer 34 that has larger gap if made of a-Si:H in FIG. 6A. Therefore, having a filter, layer 20, that selects out all frequencies $0<\omega^*<\omega_{max}$ for the PV device of FIG. 6A would make the use of multi-layer structure with such a filter somewhat illogical.

The cell design of FIG. 6C would allow for selecting out all frequencies $0<\omega^*<\omega_{max,\ 34}$, with $\omega_{max,\ 34}$ adjusted to the material of layer 34, by filter 20 and all frequencies $0<\omega^{**}<\omega_{max,\ 35}$, with $\omega_{max,\ 35}$ adjusted to layer material 35, by filter 21 in a double-junction structure. In this example, layer 35 is assumed to have a smaller bandgap than layer 34, i.e. $\omega_{max,\ 35}<\omega_{max,\ 34}$, consistently with embodiments using a-SiGe:H for layer 35, it being noted that a-SiGe:H has a smaller gap compared to a-Si:H.

Referring to FIG. 1, because of the dispersive character of band tail states, the filter stopband can advantageously be taken as $\omega_{gap}\pm\Delta\omega$, with $\Delta\omega=\Delta\omega_c+\Delta\omega_v$, where $\Delta\omega_c$ and $\Delta\omega_v$ correspond to energies $\hbar\Delta\omega_c$ and $\hbar\Delta\omega_v$, which energies measure the respective extents of the CBT and VBT. Thus, the filter stopband characteristics can be expressed in terms of fundamental characteristics of the amorphous semiconductor, which can be measured experimentally and/or calculated.

For instance, $\Delta\omega$ can be such that $\hbar\Delta\omega\sim 2E_U$, where the average Urbach energy $E_U$ is defined as the average of its CB and VB components, i.e., $E_U=(E_{UC}+E_{UV})/2$, or equivalently in terms of angular frequencies, $\Delta\omega=\Delta\omega_c+\Delta\omega_v$ with $\Delta\omega_c=E_{UC}/\hbar$ and $\Delta\omega_v=E_{UV}/\hbar$. The stopband can essentially extend between a lower limiting angular frequency $\omega_{min}=\omega_{gap}-\Delta\omega_c-\Delta\omega_v$ and an upper limiting angular frequency $\omega_{max}=\omega_{gap}+\Delta\omega_c+\Delta\omega_v$, where $\omega_{gap}$ corresponds to the optical gap $\hbar\omega_{gap}$ of the amorphous PV material, and where $\hbar\Delta\omega_c$ and $\hbar\Delta\omega_v$ are the Urbach energy of conduction band tail states and valence band tail states, respectively. Thus, the energy corresponding to the width of the stopband can essentially be $2(E_{UC}+E_{UV})$. Generally, the width of the stopband shall typically correspond to twice the sum of the extents of the CBT and VBT.

Of course, better descriptors of the dispersion of the CBT and VBT than the corresponding Urbach energies could be relied upon, e.g., for those materials for which the CBT or VBT is found to deviate from the ideal exponential behavior, etc. Other descriptors could for instance be used, which are still proportional to $E_{UC}$ and $E_{UV}$, x $E_{UC}$ and x $E_{UV}$, where $0\leq x\leq\hbar\omega_{gap}/(E_{UC}+E_{UV})$. The result to be obtained still should remain essentially the same, i.e., filtering excitations from VBT states to CBT states of the amorphous PV material. The considered stopband limiting frequencies could be refined based on knowledge of the density of energy states or other electronic structure data available for the amorphous material used, or still based on filter manufacture constraints. However, optimal stopband limiting frequencies shall likely be located within the ideal theoretical limits specified above, between $\omega_{min}=\omega_{gap}-\Delta\omega_c-\Delta\omega_v$ and $\omega_{max}=\omega_{gap}+\Delta\omega_c+\Delta\omega_v$.

The width of the tail states of the conduction band and of the valence band in amorphous semiconductors can be separately measured, by photomodulated infrared absorption. In addition, the mobility gap can be measured by conductivity experiments. Thus, all quantities needed to specify the stopband characteristics are measurable or even computable quantities, inherent to the amorphous PV materials used.

As discussed above, this amorphous PV material is preferably a-Si:H. Thus, as it can be verified, $\hbar\omega_{gap}$ is typically between 1.7 and 2.0 eV, in accordance with typical values of the gap in a-Si:H films. Investigating the energy distribution of band tail states at the Urbach edges, it appears that appropriate values for $\hbar\Delta\omega$ shall be typically less than 0.2 eV (e.g., in the range 0.05 to 0.2 eV). For good quality material, this value shall typically be close to 0.1 eV or even less.

Suited values for the stopband can be chosen according to the band gap $\hbar\omega_{gap}$ and Urbach energy values of the amorphous PV semiconductor. In that respect, the absorber can include other materials, such as hydrogenated amorphous silicon doped with germanium and/or carbon, e.g., a-Si$_{1-x}$Ge$_x$:H or a-Si$_{1-x-y}$Ge$_x$C$_y$:H, where x and y are between 0 and 1 (for example 0.1). Introduction of Ge/C atoms adds extra degrees of freedom for control of the properties of the material. In this case, increasing concentrations of carbon widen the electronic gap between conduction and valence bands; germanium results in the opposite. For completeness, the amorphous material can further include Cadmium telluride (CdTe), Copper indium diselenide CIS, an inorganic amorphous material or an organic photovoltaic material. In each of said materials, filtering excitations from VBT states to CBT states is expected to decrease the photodegradation effect.

The band-stop filter structure can be obtained in several manners. In particular, the device can have a layer structure, and the band-stop structure can result from one of more layers of said layer structure, as illustrated in FIGS. 2, 3, 6, 7 and 8.

The simplest way to obtain the desired band-stop filter is to provide a filter layer 20 or 21, on one side of the active PV layer 34, e.g., contiguous with a layer of the layer structure, as depicted in FIGS. 2, 3 and 6. This way, the filter is arranged with respect to the active material to attenuate undesired radiation wavelengths that reaches it, in operation. Obviously, the depictions of FIGS. 2, 3, 6-8 are purposely simplistic. For instance, a cover, additional filters, additional material layers, ohmic contacts, back contact, polyvinyl butyral and back side glass, etc., could be provided—(not shown), as usual in the art.

The device 10a schematically depicted in FIG. 2 is based on a single junction (p-i-n) solar cell device, according to embodiments. It includes:
    a band-stop filter layer 20;
    a p-doped semiconductor layer 32;
    a light absorbing material 34, i.e., an intrinsic a-Si based semiconductor (or i-a-Si:H); and
    a n-doped semiconductor layer 36.

The arrangement of the sole layers 32, 34 and 36 is essentially similar to prior devices. Since the mobility of holes moving towards the p-type layer is significantly lower than electrons moving towards the n-type layer, the p-type layer is placed on top, after the filter, i.e., where light intensity remains stronger, so that the collection efficiency of the holes is enhanced because the holes have to travel shorter distances than the electrons to reach the respective layers (n-type for electrons and p-type for holes). Still, layers 32, 34 and 36 are arranged "under" the band-stop filter layer 20, to attenuate or remove undesired radiation frequencies.

In this regard, any material, which can be deposited or placed on top of the solar cells and exhibit suitable filtering characteristics as described above a priori convene, provided that the overall performance of the solar cells is not compromised. Various methods are known in the art which allows for adjusting a band-stop of a band-stop filter.

For instance, the bandstop filter can be designed as a thin film, layer 20, of a material that shows strong absorption within a particular wavelength range (stop band). For example, such a layer can be made with a suitable transparent diluent, often KBr—potassium bromide, doped with an absorbing material with typical concentration ~1%. The actual concentration of the absorbing material is chosen to tune the upper and lower limiting frequencies of the band-stop filter. For example, band-stop optical filters made of potassium bromide (KBr) doped with tetramethyl ammonium halides or metal chromates can be relied upon. Many other suitable materials can be found in commonly-used databases of published optical spectra, e.g. see the Sadtler Standard Spectra.

A single-layer bandstop filter, layer 20, can also be designed as a frequency selective surface (FSS). The FSS is essentially a grated surface of some suitable dielectric material layer 20 placed on top of layer 42 that acts as a reflector for a particular range of light wavelengths (stop band of the filter), for example, such a filter can be designed as an array of periodic patches. The filter properties, upper and lower limiting frequencies, can be easily tuned by changing the layer thickness, t, between 400-900 nm, width of patches, w, about 500 nm, period of the array (p about 500-1000 nm) and refraction index of the material used for the patches. Possible materials suitable for these purposes would be chalcogenide glasses, e.g. Ge—Se or Ge—Sb—Se. Other types of surface grating as well as dielectric materials can also be used for making a band-stop filter suitable for the present invention.

Using alternating layers of high and low index dielectric materials like $Ta_2O_5/SiO_2$ (or $SiO_2/Ta_2O_5$), $TiO_2/SiO_2$ (or $SiO_2/Ta_2O_5$) for a composite filtering film 20 placed on top of glass (layer 42) also allows for designing band-stop filter with desired characteristics. Other types of dielectric materials can also be used for making a band-stop filter suitable for embodiments of the present invention.

In other words, the band-stop filter can be designed as a thin film 20, placed on top, made of a single material, or still including several layers of different materials.

The lateral dimensions of layer filter 20 or 21 can essentially be the same as those of other layers 32, 34, 35, 36, in embodiments shown in FIGS. 2, 3 6-10. Still, a filter could be provided as part of a cover, possibly clipped on the device, etc., such that the dimensions of the filter can differ from other layers'. The actual thickness of the filtering layer will depend on the chemical composition, i.e. material(s) used for the filter, as well as on the wavelength range of the light that has to be selected out by the filter. The total thickness of the filtering materials is typically on the order of the filtered light wavelength.

Also a filter can be designed as a multilayered structure. For example, layer 20 can be a dielectric Bragg mirror made of dielectric materials. Typically, the characteristic thickness should be about or larger than $\lambda = 2\pi c/\omega_M$ i.e., 600 nm for $\hbar\omega_M = 2$ eV, using standard notations.

Next, the device 10b schematically depicted in FIG. 3 is also based on a single junction (p-i-n) solar cell device, according to some embodiments of the present invention. The successive layers depicted consist of:
 a glass layer 42;
 ZnO:Al (layer 44);
 p+ a-SiC:H (layer 32);
 i-a-Si:H (layer 34); and
 n+ a-SiC:H (layer 36);

The layer arrangement of the sole layers 42, 44, 32, 34, and 36 is again similar to prior art devices. Namely, Si-based layers are deposited on glass 42, coated with a layer of transparent conducting oxide (ZnO:Al). However, a band-stop filter layer 20 is placed on top, which filter has the desired properties that are discussed above.

Figure 9:
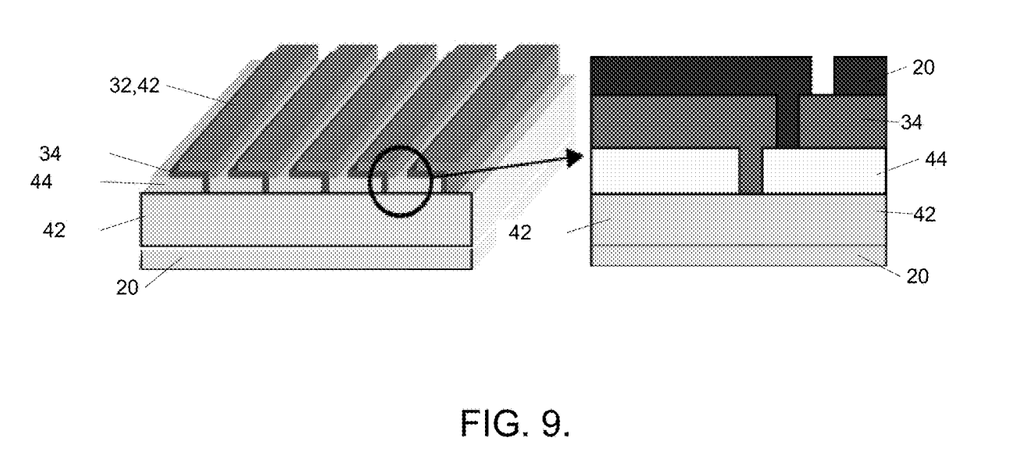
FIG. 9 is a simplified 3D view of a photovoltaic device based on a series interconnection of integrated a-Si:H cells, according to a further embodiment of the present invention.

Expanding on this, FIG. 9 schematic represents a series interconnection of monolithically integrated a-Si:H subcells. Namely, FIG. 9 shows from bottom to top successively:
 a filter layer (or cover layer) 20 placed on the light path to the active layers (in FIG. 9 light is assumed to come from bottom);
 a glass layer 42 (note that in variants layers 20 and 42 could be one and a same layer);
 a transparent conducting oxide or TCO 44;
 a-Si:H layers 34; and
 back electrodes 46;

Integration of subcells such as depicted in FIG. 9 can be obtained by conventional masking techniques. Laser scribing can also be used. Monolithic integration of a-Si:H cells notably allows for easily achieving a desired output voltage from a single substrate. Also, process steps for the integration of the subcells are easily implemented in the whole fabrication process of the module, as known per se.

Other variations shall be described later in reference to FIGS. 6-8 and 10.

Figure 4:
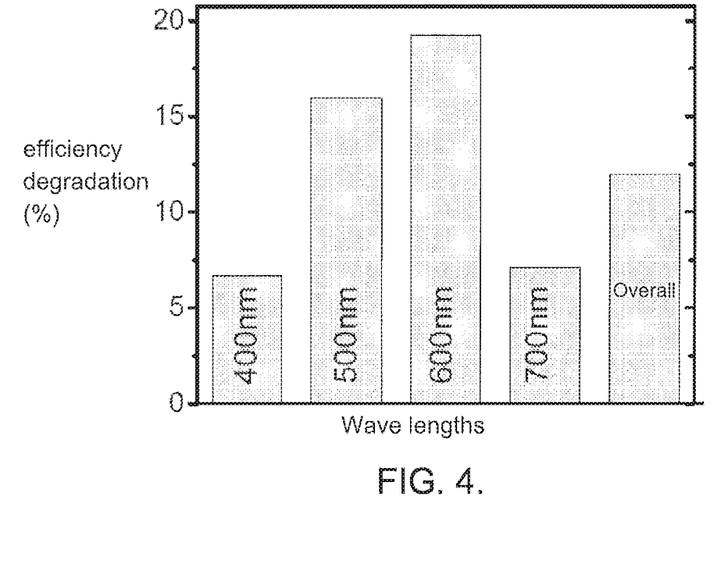
FIG. 4 represents the efficiency degradation, which is expressed in percentage (%), as obtained experimentally for a a-Si:H-based solar cell design and for selected wavelengths according to a further embodiment of the present invention.
Figure 5:
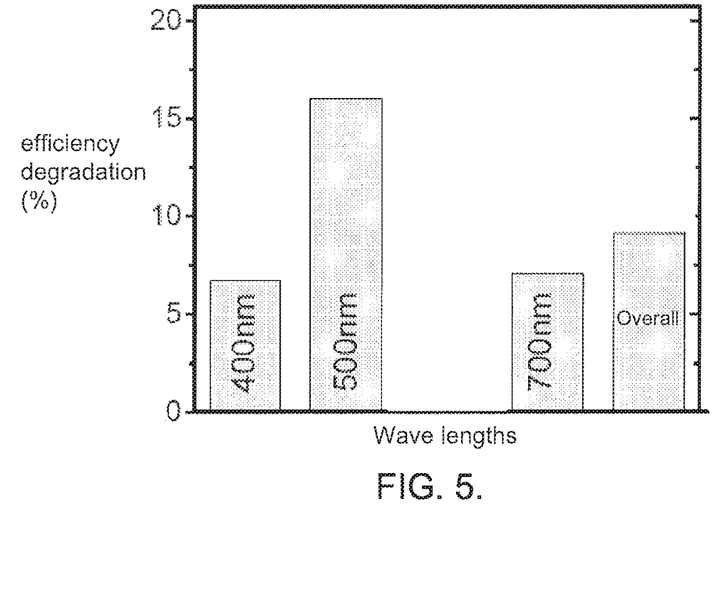
FIG. 5 represents an efficiency degradation as in FIG. 4, but this time obtained for a a-Si:H-based solar cell design equipped with a band-stop filter according to a further embodiment of the present invention.

To demonstrate advantages of a band-stop filter as described above i.e., coupled to a solar cell to reduce light-induced degradation, it is sufficient to show the dependence of photodegradation on the wavelength of the absorbed light. Present inventors have performed yield measurements for a set of a-Si-based solar cells with narrow bandpass filters that select radiation with particular wavelengths. The solar cells used were a-Si-based solar cells as shown in FIG. 3, except that a bandpass filter was used instead of a band-stop filter at the level of layer 20 in FIG. 3, to select a desired wevelength. Results of this experiment are shown in FIG. 4, which represents the efficiency degradation (in percentage %) for selected wavelengths. The last column represent the overall efficiency degradation (in percentage %). These results show that photodegradation markedly depends on the wavelength and reaches its maximum around 600 nm. This value corresponds to photon energy $\hbar\omega \sim 2\pm 0.2$ eV, in line with values $\hbar\omega^* \pm \hbar\Delta\omega$ mentioned earlier. In other words, a band-stop light filter that attenuates the photons in this energy range can be expected to reduce the overall photodegradation of the solar cell, as otherwise shown in FIG. 5. FIG. 5 is similar to FIG. 4, except that the results were obtained for a solar cell design equipped with a band-stop filter as in FIG. 3. As seen, the overall efficiency degradation (last column) is substantially decreased, by ~35% in this example.

This reduction of the overall efficiency degradation leads to an improvement of the solar cell performance on the long-term usage of the solar cells, allowing for more efficient collection of the solar energy, i.e. generating more electrical power from the sun radiation. For example, reducing the overall efficiency degradation by 25%, 50% and 100% will increase stable yield of the currently-manufactured state-of-the-art solar cells up to ~5%, 10% and 20%, respectively, which corresponds to equivalent increase of the generated electrical energy. Such increases would be considered as substantial in mass production of solar energy. As discussed above, a band-stop filter structure can consist of a simple filter placed on top of the device. In variations discussed below, the band-stop filter structure can result from a more complex design.

For instance, the PV device can have a layer structure that includes a repeating pattern of two contiguous layers (or more) of different materials, e.g., a a-Si:H layer 34 and a a-SiGe:H layer 35, as illustrated in FIGS. 6-7. Layer 34 can for instance be the active layer, while layer 35 is more specifically designed to absorb undesired radiation frequencies, as schematically represented in FIG. 7.

Layer 35 (a-SiGe:H) could be active as well. For instance, layer 35 is also active if its thickness is comparable to that of layer 34, which is the case for devices in FIGS. 6 and 7, and layer 35 then absorbs efficiently photons that are harmful for layer 34 despite of being weakly absorbed by layer 34 (a-Si:H), i.e., photons with energies between $\hbar\omega_M$ corresponding to a-Si:H layer and $\hbar\omega_M$ corresponding to a-SiGe:H layer. The latter is smaller than the former, and $\hbar\omega_M$ is decreasing upon an increase of the Ge-concentration. Layer 35 then has a double role in this case: (i) to protect layer 34 from a harmful part of the light spectrum, and (ii) to convert this radiation into electricity, increasing the PV cell efficiency.

The filter layer 20 (21) in FIG. 6A (6B) is on top of layer 34 (layer 35), and filter characteristics have to be adjusted to properties of layer 34 (layer 35) since it is sought to select out $\omega<\omega_M$, where $\hbar\omega_M$ is a mobility gap of a-Si:H (a-SiGe:H), which is larger (smaller) than that of a-SiGe:H (a-Si:H).

FIG. 6C shows an alternative design that has two filter layers 20 and 21. Layers 34 and 35 can be chemically/dimensionally tuned to that aim. Tuning the concentration of Ge and C dopants as well as hydrogen concentration allows for tuning the absorption range of layers 34 and 35. In that respect, material compatibility offered by a-Si:H/a-SiGe:H can be advantageously used. For example, chemical composition for layer 34 could be hydrogenated amorphous silicon (a-Si:H) obtained with PECVD, where typical concentration of hydrogen is about 10% or atomic percents, meaning 1 H atom for 9 Si atoms on average. Concerning layer 35: hydrogenated amorphous silicon can e.g., be doped with germanium (a-Si$_{1-x}$Ge$_x$:H) with about 10% hydrogen concentration and germanium concentration in the range: $0.25<x<0.75$ as typical for state-of-the-art solar cells.

Concerning the dimensions: lateral dimensions (aperture area) are macroscopic, and can for instance be of a few hundreds cm$^2$. Therefore, the on-top filter 20 can be supplemented by additional "absorbing" layers 35, as in the device 10c of FIG. 6A, where undesired radiation wavelengths are first reflected and the residual undesired radiation is then absorbed. In variants, only "absorbing" layers 35 are provided, as in the device 10d of FIG. 7, where undesired radiation wavelengths are absorbed in layers 35.

According to some embodiments of the present invention, instead of using a filter single layer, a super-lattice is used which acts as a dielectric omnidirectional reflector (dielectric Bragg mirror) for radiations having undesired frequencies, as in FIG. 8. To that aim, repeating layers can be relied upon, which are suitably engineered to provide the desired stopband range. For example, the repeating pattern of layers 34/35, which is coupled to a homogeneous medium 30 (such as air), can even be dimensioned such as to form an omnidirectional reflector, as illustrated in FIG. 8, i.e., the latter reflecting radiations (irrespective of the angle of incident light) having frequencies within the stopband. Given the upper and lower limiting frequencies $\omega_{min}$ and $\omega_{max}$, with typical values about 1.6 eV and 1.8 eV, respectively, and the refraction indices of layer 34, $n_{34}\sim 3.4$ for a-Si:H with typical hydrogen concentration about 10%, layer 35, $n_{35}\sim 4.5$ for a-Si$_{1-x}$Ge$_x$:H with typical Ge concentration $x\sim 0.25$-$0.75$ and typical hydrogen concentration about 10%, and homogeneous medium 30, typically air with $n_{30}=1$, thicknesses of layer 34 ($h_{34}$) and layer 35 ($h_{35}$) can be obtained using a relation between $\omega_{min}$, $\omega_{max}$ and $h_{34}$, $h_{35}$, $n_{34}$, $n_{35}$, $n_{30}$ as given by two analytical expressions that have been derived in another context by Y. Fink, et al., Science 282, 1679 (1998). For example, for the characteristics of layer 34/35 as given above and homogeneous medium 30, the thickness of the main absorber (layer 34) is about 50-100 nm, which values are otherwise suitable for manufacturing thin film solar cells, and the thickness of the secondary absorber (layer 35) is about 5-10 nm. Other designs of omnidirectional reflector can be contemplated, as one skilled in the art can realize. All the parameters of layer 34, 35 and homogeneous medium 30 can be simultaneously tuned to match the omnidirectional frequency range of the reflector with a desirable stopband range $\omega_{min}$, $\omega_{max}$, provided that the overall performance of the solar cells (FIG. 8) is not compromised. Reference for typical refraction indexes of a-Si:H and a-SiGe:H can be found in W.W. Hernández-Montero et al, Optical Materials Express 2, 358 (2012).

Figure 10:
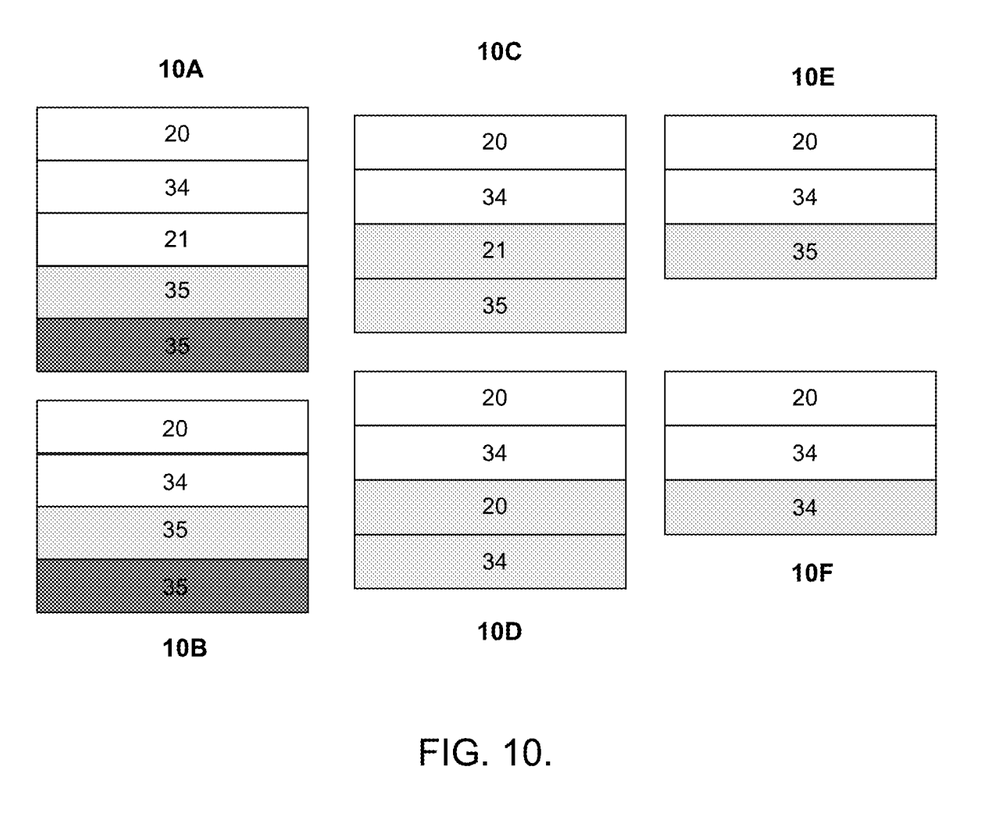
FIG. 10 are schematic representations of multiple-junction photovoltaic devices, namely triple junction devices (A-B) and double-junction devices (C-F) according to further embodiments of the present invention.

More designs of PV devices are briefly described in reference to FIG. 10, where schematic representations of multiple-junction photovoltaic devices are represented. Namely, triple junction devices are shown in FIGS. 10A-B, whereas FIGS. 10C-F concerns double-junction devices. Double-junction cells can include layer 34 (e.g., a-Si:H) and layer 35 (e.g., a-Si$_{1-x}$Ge$_x$:H). The two layers can, in variants, both include a-Si:H. However, one of the a-Si:H layers could have a bandgap different from that of the other layer 34, a thing that can be done by changing hydrogen concentration in the second a-Si:H layer. Similarly, the triple-junction cell can include layer 34 (a-Si:H), followed by another layer 35 (a-Si$_{1-x}$Ge$_x$:H), and then by another layer 35 (a-Si$_{1-y}$Ge$_y$:H), where x differs from y, i.e., such that bandgaps of the two a-SiGe:H materials differ. Filter layers 20 and 21 are then adjusted according to properties of absorbing material layers 34, 35, as recited earlier.

Finally, practical implementations of present photovoltaic device could take the form of a package, notably including thin-film PV cells, electrodes, as well as other components as usual in the art. Such devices can further include a shield to protect some of these components from exposure to radiations. In addition, the shield can be arranged to encapsulate the cell package to protect against dust, humidity, etc. The shield can further include a cover window. In other variations, the filter structure can be placed contiguous with the window or this window could even be used as a filter, to filter undesired frequencies, instead of providing a filter layer as described above. More generally, a filter having characteristics as described earlier could be embedded as part of such a shield.

While the present invention has been described in reference to certain embodiments, it will be understood by those skilled in the art that various changes can be made and equivalents can be substituted without departing from the scope of the present invention. In addition, many modifications can be made to adapt a particular situation or material to the teachings of the present invention without departing from its scope. Therefore, it is intended that the present invention will not be limited to the particular embodiments disclosed, but that the present invention will include all embodiments falling within the scope of the appended claims. Thus, many variations are possible. For example, other materials, chemical compositions and layer dimensions than those recited in the above examples could be used to obtain essentially the same results as provided in embodiments of this invention, i.e., where the filter's stopband corresponds to electronic excitations from VBT states to CBT states of the amorphous material used as absorber.

Another embodiment of the present invention provides a photovoltaic device that can include an energy $\hbar\omega_{max}$ corresponding to an upper limiting angular frequency $\omega_{max}$ of the stopband is less than or equal to a mobility gap $\hbar\omega_M$ of the amorphous photovoltaic material, and preferably is equal to said mobility gap $\hbar\omega_M$.

Another embodiment of the present invention provides a photovoltaic device that can include an energy $\hbar\omega_{min}$ corresponding to the lower limiting angular frequency of the stopband is less than an optical gap $\hbar\omega_{gap}$ of the amorphous photovoltaic material.

Another embodiment of the present invention provides a photovoltaic device that can include an energy $2\hbar(\Delta\omega_c+\Delta\omega_v)$ corresponding to a width of the stopband of the amorphous material corresponds to twice the sum of: an energy $\hbar\Delta\omega_c$ corresponding to the extent of a conduction band tail of the amorphous photovoltaic material and an energy $\hbar\Delta\omega_v$ corresponding to the extent of a valence band tail of the amorphous photovoltaic material.

Another embodiment of the present invention provides a photovoltaic device that can include the stopband extends between a lower limiting angular frequency $\omega_{min}=\omega_{gap}-\Delta\omega_c-\Delta\omega_v$ and an upper limiting angular frequency $\omega_{max}=\omega_{gap}-\Delta\omega_c-\Delta\omega_v$, wherein $\omega_{gap}$ corresponds to an optical gap $\hbar\omega_{gap}$ of the light absorbing material, and wherein $\Delta\omega_c$ and $\Delta\omega_v$ respectively correspond to energies $\hbar\Delta\omega_c$ and $\hbar\Delta\omega_v$, respectively corresponding to the extent of a conduction band tail of the amorphous photovoltaic material and the extent of a valence band tail of the amorphous photovoltaic material.

Another embodiment of the present invention provides a photovoltaic device that can include $\hbar\Delta\omega_c$ and $\hbar\Delta\omega_v$ are the Urbach energy of conduction band tail states and the Urbach energy of valence band tail states.

Another embodiment of the present invention provides a photovoltaic device that can include the amorphous photovoltaic material comprises hydrogenated amorphous silicon.

Another embodiment of the present invention provides a photovoltaic device that can include the amorphous photovoltaic material comprises hydrogenated amorphous silicon and: $\hbar\omega_{gap}$ is between 1.7 and 2.0 eV; and $\hbar\Delta\omega_c+\hbar\Delta\omega_v$ is less than 0.2 eV, and preferably is between 0.1 and 0.2 eV.

Another embodiment of the present invention provides a photovoltaic device that can include the amorphous photovoltaic material includes hydrogenated amorphous silicon doped with germanium or doped with germanium and carbon:
  Cadmium telluride (CdTe);
  Copper indium diselenide (CIS);
  an inorganic amorphous material; or
  an organic photovoltaic material;

Another embodiment of the present invention provides a photovoltaic device that can include the device has a layer structure, with one of more layers of said layer structure forming the band-stop structure.

Another embodiment of the present invention provides a photovoltaic device that can include the layer structure that further includes a pattern of two or more contiguous layers of different materials, preferably a-Si:H and a-SiGe:H, this pattern being repeated along the layer structure.

Another embodiment of the present invention provides a photovoltaic device that can include one of the contiguous layers is designed to absorb radiation frequencies within the stopband, and another one of said contiguous layers, preferably both contiguous layers, comprises said amorphous photovoltaic semiconductor material.

Another embodiment of the present invention provides a photovoltaic device that can include the layer structure forms a Bragg reflector, the latter configured to reflect radiations with frequencies within the stopband, and preferably configured as an omnidirectional reflector.

Another embodiment of the present invention provides a photovoltaic device that can include the band-stop structure is a band-stop filter layer contiguous with a layer of the layer structure.

What is claimed is:

1. A photovoltaic device, comprising:
  an active photovoltaic device region comprising alternating layers of different amorphous photovoltaic materials,
  a first band-stop filter structure on the active photovoltaic device region;
  an intermediate photovoltaic layer on the first band-stop filter structure;
  a second band-stop filter structure on the first band-stop filter structure intermediate photovoltaic layer such that the intermediate photovoltaic layer is interposed between the first and second first and second band-stop filter structures,
  wherein each of the first and second band-stop filter structures comprise:
  alternating layers of dielectric materials having a stopband extending from a lower limiting angular frequency $\omega_{min}\geq 0$ to an upper limiting angular frequency $\omega_{max}$, wherein $\omega_{max}>\omega_{min}$, the first band-stop filter structure on the active photovoltaic device region such that the alternating layers of different amorphous photovoltaic materials are arranged completely beneath the first and second band-stop filter structures and such that the at least one of the first and second band-stop filter structure is arranged in the photovoltaic device relative to the alternating layers of different amorphous photovoltaic materials in order to block electromagnetic radiations reaching portions of the alternating layers of different amorphous photovoltaic materials with angular frequencies of $\omega^*$ in the stopband, so that $\omega_{min}<\omega^*<\omega_{max}$;
  wherein said angular frequencies $\omega^*$ correspond to blocked electronic excitations $\hbar\omega^*$ from valence band tail (VBT) states of each amorphous photovoltaic material included in the alternating layers of different amorphous photovoltaic materials to conduction band tail (CBT) states of each amorphous photovoltaic material included in the alternating layers of different amorphous photovoltaic materials;
  wherein the angular frequencies of the blocked electromagnetic radiations are the same as the angular frequencies that correspond to the blocked electronic excitations;
  wherein light at angular frequencies $\omega^*$ cause light-induced degradation of the photovoltaic device,
  wherein $\omega_{max}$ is based on an Urbach energy component $E_{UC}$ of a conduction band tail region,
  wherein $\omega_{min}$ is based on an Urbach energy component $E_{UV}$ of a valence band tail region, and
  wherein the photovoltaic device permits electromagnetic radiations reaching portions of a given amorphous photovoltaic material included in the alternating layers of different amorphous photovoltaic materials with angular frequencies of $\omega^*$ in the stopband, where the electromagnetic radiations have angular frequencies that are $>\omega_{max}$ or $<\omega_{min}$.

2. The photovoltaic device according to claim 1, wherein an energy $\hbar\omega_{max}$ corresponding to an upper limiting angular frequency $\omega_{max}$ of the stopband is less than a mobility gap $\hbar\omega_M$ of a given amorphous photovoltaic material included in the alternating layers of different amorphous photovoltaic materials.

3. The photovoltaic device according to claim 1, wherein an energy $\hbar\omega_{max}$ corresponding to an upper limiting angular frequency $\omega_{max}$ of the stopband is equal to a mobility gap $\hbar\omega_M$ of a given amorphous photovoltaic material included in the alternating layers of different amorphous photovoltaic materials.

4. The photovoltaic device according to claim 1, wherein an energy $\hbar\omega_{min}$ corresponding to the lower limiting angular frequency of the stopband is less than an optical gap $\hbar\omega_{gap}$ of a given amorphous photovoltaic material included in the alternating layers of different amorphous photovoltaic materials.

5. The photovoltaic device according to claim 1, wherein an energy comprising $2\hbar(\Delta\omega_c+\Delta\omega_v)$ and corresponding to a width of the stopband of a given amorphous photovoltaic material included in the alternating layers of different amorphous photovoltaic materials is twice the sum of:
    a first energy change $\hbar\Delta\omega_c$ that corresponds to the extent of the conduction band tail region of a given amorphous photovoltaic material included in the alternating layers of different amorphous photovoltaic materials; and
    a second energy change $\hbar\Delta\omega_v$ that corresponds to the extent of the valence band tail region of a given amorphous photovoltaic material included in the alternating layers of different amorphous photovoltaic materials.

6. The photovoltaic device according to claim 5, wherein a frequency corresponding to a gap energy $\omega_{gap}$ corresponds to an optical gap energy $\hbar\omega_{gap}$ of a given amorphous photovoltaic material included in the alternating layers of different amorphous photovoltaic materials.

7. The photovoltaic device according to claim 5, wherein a change in frequency corresponding to a first energy $\Delta\omega_c$ and a change in frequency corresponding to a second energy $\Delta\omega_v$ correspond to the first energy change $\hbar\Delta\omega_c$ and the second energy change $\hbar\Delta\omega_v$ respectively, and correspond to the extent of the conduction band tail region of a given amorphous photovoltaic material included in the alternating layers of different amorphous photovoltaic materials and the extent of the valence band tail region of a given amorphous photovoltaic material included in the alternating layers of different amorphous photovoltaic materials, respectively.

8. The photovoltaic device according to claim 1, wherein the alternating layers of different amorphous photovoltaic materials comprises hydrogenated amorphous silicon (a-SI:H) and hydrogenated amorphous silicon doped with germanium (a-Si1-xGex:H).

9. The photovoltaic device according to claim 5, wherein at least one of the alternating layers comprises hydrogenated amorphous silicon wherein a gap energy $\hbar\omega_{gap}$ is between 1.7 and 2.0 eV and a sum of the first energy change and the second energy change $\hbar\Delta\omega_c+\hbar\Delta\omega_v$ is less than 0.2 eV.

10. The photovoltaic device according to claim 5, wherein at least one amorphous photovoltaic material included in the alternating layers of amorphous photovoltaic materials comprises hydrogenated amorphous silicon wherein a gap energy $\hbar\omega_{gap}$ is between 1.7 and 2.0 eV and a sum of the first energy change and the second energy change $\hbar\Delta\omega_c+\hbar\Delta\omega_v$ is between 0.1 eV and 0.2 eV.

11. The photovoltaic device according to claim 1, wherein the amorphous photovoltaic material comprises at least one of the following:
    hydrogenated amorphous silicon doped with germanium (a-Si1-xGex:H) or doped with germanium and carbon (a-Si$_{1-x-y}$Ge$_x$C$_y$:H);
    an inorganic amorphous material; and
    an organic photovoltaic material.

12. The photovoltaic device according to claim 1, wherein the photovoltaic device has a layer structure, wherein one or more layers of said layer structure forms at least one of the first and second band-stop filter structures.

13. The photovoltaic device according to claim 10, wherein a layer structure of the photovoltaic device comprises a pattern of two or more contiguous layers of different materials and the pattern is repeated along the layer structure.

14. The photovoltaic device according to claim 13, wherein at least one layer of amorphous photovoltaic material included in the alternating layers of different amorphous photovoltaic materials is designed to absorb radiation frequencies within the stopband.

15. The photovoltaic device according to claim 10, wherein the alternating layers of different amorphous photovoltaic materials forms a Bragg reflector configured to reflect radiations with frequencies within the stopband.

16. The photovoltaic device according to claim 10, wherein the first band-stop filter structure is a band-stop filter layer contiguous with one layer of a the alternating layers of different amorphous photovoltaic materials.

17. The photovoltaic device according to claim 1, wherein the intermediate photovoltaic layer is formed from a semiconductor material.

* * * * *